United States Patent
Farahani et al.

(10) Patent No.: US 8,174,084 B2
(45) Date of Patent: May 8, 2012

(54) STRESS SENSOR FOR IN-SITU MEASUREMENT OF PACKAGE-INDUCED STRESS IN SEMICONDUCTOR DEVICES

(75) Inventors: Mohammad M. Farahani, Chandler, AZ (US); Vladimir Noveski, Chandler, AZ (US); Neha M. Patel, Chandler, AZ (US); Nachiket R. Raravikar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 331 days.

(21) Appl. No.: 11/523,835

(22) Filed: Sep. 19, 2006

(65) Prior Publication Data

US 2008/0067619 A1    Mar. 20, 2008

(51) Int. Cl.
*H01L 29/84* (2006.01)
(52) U.S. Cl. .......... 257/417; 257/13; 257/E21.858; 257/E23.165; 438/48
(58) Field of Classification Search .......... 257/13, 257/417; 977/762, 949; 438/48
See application file for complete search history.

(56) References Cited

U.S. PATENT DOCUMENTS

| | | | |
|---|---|---|---|
| 7,560,366 B1 * | 7/2009 | Romano et al. | 438/503 |
| 2002/0117659 A1 * | 8/2002 | Lieber et al. | 257/14 |
| 2004/0112964 A1 * | 6/2004 | Empedocles et al. | 235/491 |
| 2005/0215049 A1 * | 9/2005 | Horibe et al. | 438/622 |
| 2006/0071334 A1 * | 4/2006 | Kawabata et al. | 257/741 |
| 2006/0086958 A1 * | 4/2006 | Eimori | 257/301 |
| 2006/0091557 A1 * | 5/2006 | Sakamoto et al. | 257/774 |
| 2006/0194058 A1 * | 8/2006 | Amlani et al. | 428/408 |
| 2006/0281306 A1 * | 12/2006 | Gstrein et al. | 438/666 |
| 2006/0283262 A1 * | 12/2006 | Smits et al. | 73/799 |
| 2007/0096326 A1 * | 5/2007 | Chang et al. | 257/764 |
| 2007/0096616 A1 * | 5/2007 | Han et al. | 313/309 |
| 2007/0246364 A1 * | 10/2007 | Amlani et al. | 204/547 |

FOREIGN PATENT DOCUMENTS

JP    2005-72171    * 3/2005

* cited by examiner

*Primary Examiner* — A. Sefer
(74) *Attorney, Agent, or Firm* — Blakely, Sokoloff, Taylor & Zafman LLP (57) ABSTRACT

A stress sensor is disclosed herein. The stress sensor includes a plurality of carbon nanotubes in a substrate, and first and second contacts electrically connectable with the plurality of carbon nanotubes. Methods of making and using the stress sensor are also disclosed.

10 Claims, 6 Drawing Sheets

STRESS SENSOR FOR IN-SITU MEASUREMENT OF PACKAGE-INDUCED STRESS IN SEMICONDUCTOR DEVICES

FIELD OF THE INVENTION

The present invention relates generally to semiconductor structures and manufacturing. In particular, the present invention relates to a stress sensor for semiconductor structures.

BACKGROUND OF THE INVENTION

Advances in semiconductor manufacturing technology have led to the integration of billions of circuit elements, such as transistors, on a single integrated circuit (IC). In order to integrate increasing numbers of circuit elements onto an integrated circuit it has been necessary to reduce the dimensions of the electronic devices (e.g., a metal-oxide-semiconductor (MOS) transistor).

A typical packaged integrated circuit unit includes a die in or on which the integrated circuit is formed and a package substrate on which the die is mounted. An interconnect structure connects the terminals of the die from the integrated circuit in the die to the terminals of the package, which can be further connected to other components through a circuit board. The package may be directly mounted on the circuit board, or through a socket or an interposer.

Semiconductor manufacturers desire an understanding of the stress-induced performance and reliability effects for these scaled electronic devices. Destructive techniques are typically used to measure stress levels in the die. Strain gauge rosettes have been considered for placement on the die, but are not sufficiently accurate or robust at these smaller scales. Thus, there are no current non-destructive methods to accurately determine stress levels in semiconductor devices.

BRIEF DESCRIPTION OF THE DRAWINGS

The invention is described by way of example with reference to the accompanying drawings, wherein.

DETAILED DESCRIPTION

A stress sensor, methods of making the stress sensor and methods of using the stress sensor are disclosed herein. The stress sensor uses, in one embodiment, carbon nanotubes that are embedded in a surface of a substrate of the die. When stress is induced in the die, the nanotubes respond to the stress. The response of the nanotubes can be measured and correlated to a stress value.

Figure 1:
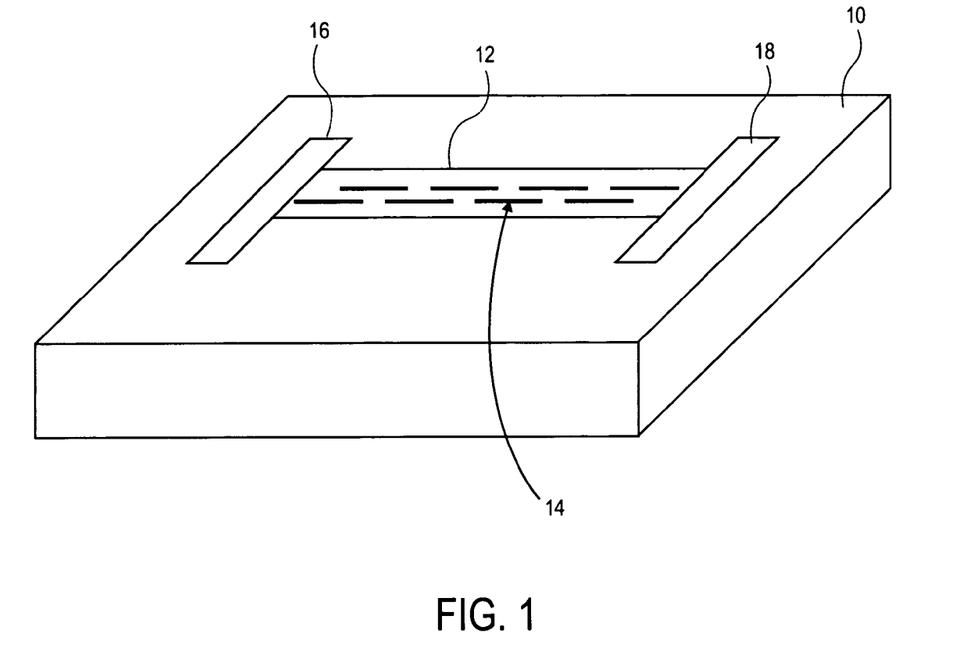
FIG. 1 is a perspective view of a substrate having a stress sensor according to an embodiment of the invention.

As shown in FIG. 1 of the accompanying drawings, a stress sensor is included in a die. The die may include any well-known substrate or material on which integrated circuits are typically formed.

The stress sensor includes a substrate 10, a trench 12, nanotubes 14 and first and second contacts 16, 18. The trench 12 is formed between the first and second contacts 16, 18 and in the substrate 10. The nanotubes 14 are deposited in the trench 12 between the first and second contacts 16, 18. In one embodiment, the nanotubes are aligned in the same direction as the length of the trench 12. In one embodiment, the nanotubes 14 form a conductive path.

Any well-known substrate, such as, but not limited to, single crystalline bulk silicon may be used. In one embodiment, the substrate 10 is a silicon wafer. The substrate 10 may be a silicon-on-insulator structure. The substrate 10 may be formed from other materials, such as, but not limited to, germanium, indium antimonide, lead telluride, indium arsenide, indium phosphide, gallium arsenide, gallium antimonide and the like.

The trench 12 is for holding the nanotubes 14. In one embodiment, several trenches are formed in the substrate 10. In one embodiment, several hundred trenches are formed in the substrate 10. In one embodiment, a cross-section of the nanotubes in the trench includes a few hundred nanotubes.

The trench 12 may be any depth, length and/or width. In one embodiment, the depth of the trench 12 is similar to the depth of a transistor in a substrate.

The nanotubes 14 are provided in the substrate 10 to respond to stress induced in the substrate 10. The nanotubes 14 show a change in voltage across their length in response to stress because the stress causes changes in the bond length and angle, giving rise to changes in their band structure and band gap.

The nanotubes 14 may be metallic, dielectric or semiconductor nanotubes. The nanotubes 14 may be carbon nanotubes. In one embodiment, the carbon nanotubes can be either single walled carbon nanotubes (SWCN) or multi-walled carbon nanotubes.

The nanotubes 14 may be deposited as a film or form a film which is within the trench.

First and second contacts 16, 18 measure the current-voltage response in the nanotubes 14. The contacts 16, 18 are conductors.

The first and second contacts 16, 18 may be any appropriate metal that can make ohmic contact with the nanotubes 14, such as, for example, carbide forming metals. Exemplary carbide forming metals include Ni and Ti. In another embodiment, the contacts 16, 18 are aluminum, silver, copper or gold.

Figure 2:
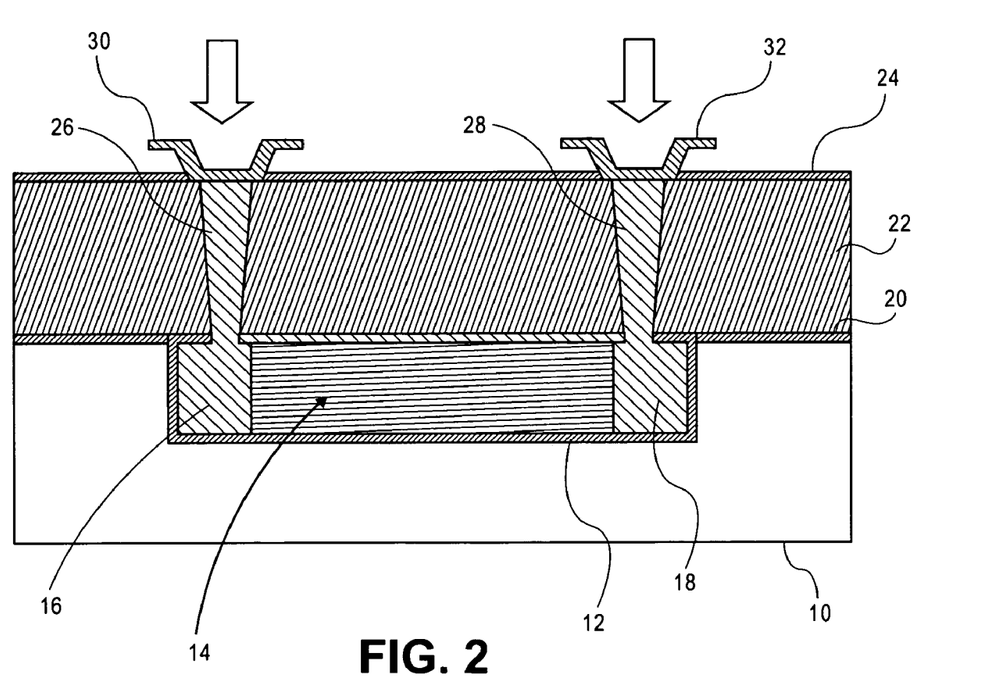
FIG. 2 is a side cross-sectional view of a substrate having a stress sensor according to an embodiment of the invention.

FIG. 2 shows the stress sensor embedded in a die.

The die includes the substrate 10, trench 12, nanotubes 14, first and second contacts 16, 18, a passivation layer 20, an interlayer dielectric (ILD) 22, a top layer 24, first and second contact extensions 26, 28 and first and second contact pads 30, 32.

Passivation layer 20, ILD 22, top layer 24, and contact pads 30, 32 may be any well-known material and deposited using well-known techniques. Contact extensions 26, 28 are typically the same material as contacts 16, 18 and are formed using well-known techniques. In one embodiment, the passivation layer 20 is SiN, ILD 22 is SiO2, and top layer 24 is SiN. In one embodiment, the contact pads 30, 32 are WB pads.

FIGS. 3-17 illustrate a method of making the stress sensor in accordance with one embodiment of the invention.

Figure 3:
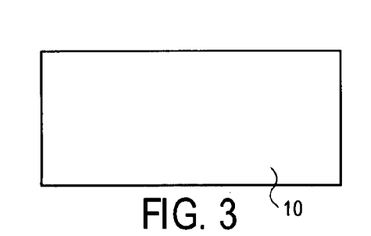
FIG. 3 is a side cross-sectional view of a substrate according to an embodiment of the invention.

As shown in FIG. 3, the process begins by providing a substrate 10.

Figure 4:
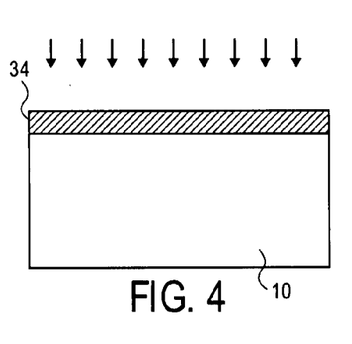
FIG. 4 is a side cross-sectional view of resist formation on the substrate according to an embodiment of the invention.

As shown in FIG. 4, the process continues by forming a resist layer 34 over the substrate 10. The resist is formed using well-known techniques.

Figure 5:
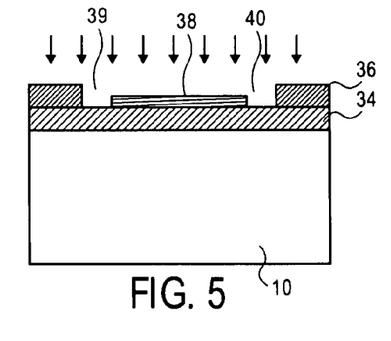
FIG. 5 is a side cross-sectional view of mask formation and resist development exposure according to an embodiment of the invention.

As shown in FIG. 5, the process continues by forming a mask 36 over the resist layer 34. The illustrated mask has first, second and third openings 38, 39 and 40 therein. The first opening 38 corresponds to the trench 12 and the second and third openings 39, 40 correspond to the first and second contacts 16, 18. It will be appreciated that the mask may include multiple openings corresponding to multiple trenches and contacts associated with each trench.

Figure 6:
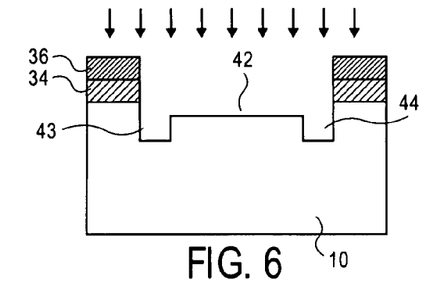
FIG. 6 is a side cross-sectional view of a dry etch of the substrate according to an embodiment of the invention.

As shown in FIG. 6, the process continues by etching the substrate 10 to form first, second and third openings 42, 43 and 44 in the substrate 10. The first opening 42 corresponds to the trench 12 and the second and third openings 43, 44 correspond to the first and second contacts 16, 18. As described above, the substrate 10 may include multiple openings corresponding to multiple trenches and contacts associated with each trench.

The etching process may be a conventional dry etch process or an anisotropic wet etch, or other known etching techniques.

Figure 7:
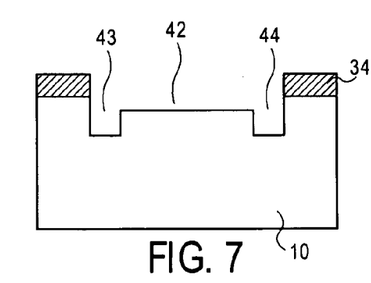
FIG. 7 is a side cross-sectional view of a first resist clean according to an embodiment of the invention.
Figure 8:
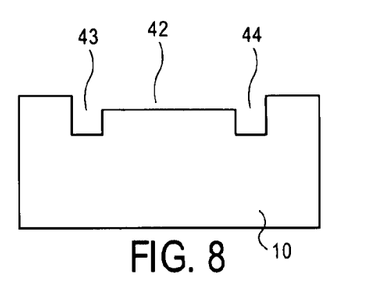
FIG. 8 is a side cross-sectional view of a second resist clean according to an embodiment of the invention.

As shown in FIG. 7, the process continues by removing the mask and the resist, as shown in FIG. 8. When the mask and resist have been removed, the substrate includes openings corresponding to the openings in the mask for the trench(es) and associated contacts, as described above. The mask and resist may be removed using well-known techniques.

Figure 9:
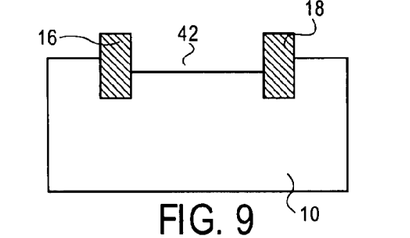
FIG. 9 is a side cross-sectional view of deposition of metal contacts in the substrate according to an embodiment of the invention.
Figure 10:
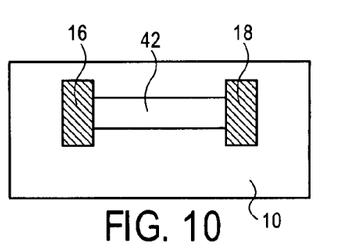
FIG. 10 is a top view of the metal contacts deposited in the substrate according to an embodiment of the invention.

As shown in FIG. 9, the process continues by forming the contacts 16, 18 in the openings 43, 44 in the substrate 10. FIG. 10 shows the contacts 16, 18 from a different perspective (top view). In one embodiment, the contacts are conductors formed by, for example, chemical vapor deposition (CVD), plasma vapor deposition (PVD) or plating.

Figure 11:
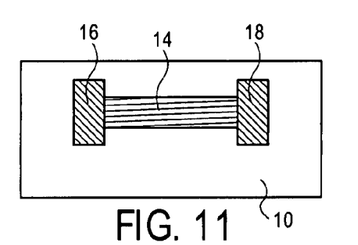
FIG. 11 is a top view of the carbon nanotubes deposited in a trench between the contacts in the substrate according to an embodiment of the invention.

As shown in FIG. 11, the process continues by depositing nanotubes 14 between the first and second contacts 16, 18.

Although the process has been described as deposition of the contacts 16, 18 followed by deposition of the nanotubes 14 into the trench 12, it will be appreciated that the process may include deposition of the nanotubes 14 into the trench 12 followed by deposition of the contacts 16, 18.

Figure 11A:
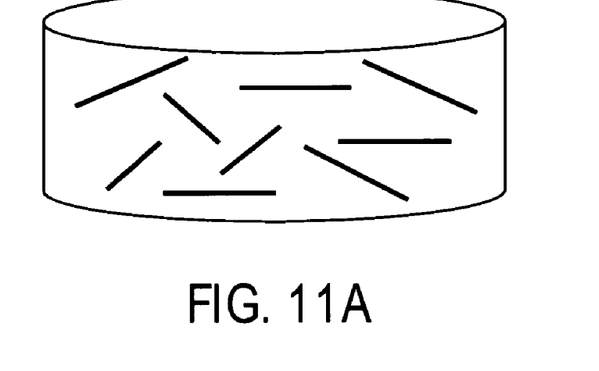
FIG. 11A is a schematic view of non-aligned carbon nanotubes in a suspension according to an embodiment of the invention.
Figure 11B:
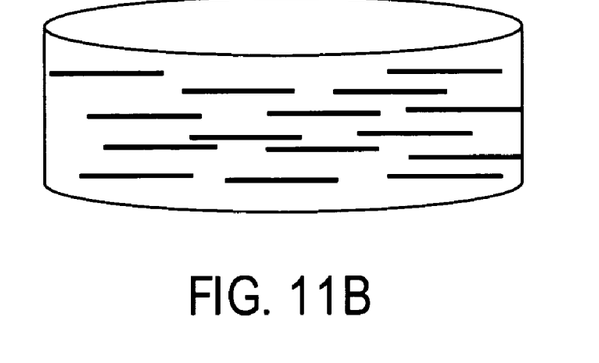
FIG. 11B is a schematic view of aligned carbon nanotubes in a suspension according to an embodiment of the invention.

The process for depositing the nanotubes will now be described in further detail and with reference to FIGS. 11A-11C.

The trench 12 may be formed using a conventional dry etch process or an anisotropic wet etch, as described above.

The nanotubes may be integrated onto the silicon surface in a number of ways. As discussed above, multiple nanotubes should contact each other, to form an electrically conducting path, and the nanotubes should be aligned in the direction of the trench.

In one embodiment, nanotubes are dispensed directly into the trench 12 from their suspension. The suspension of nanotubes is shown in FIG. 11A. In one embodiment, a pipette is used to dispense the nanotubes 14 into the trench 12. A uniform nanotube suspension is typically made in a solvent, such as, acetone or toluene, by ultrasonication. The nanotubes are then dispensed into the trench using, for example, a pipette. A solvent evaporation follows the deposition. Multiple dispenses may be required to ensure the trench is filled with aligned nanotubes. Any non-aligned nanotubes and extra nanotubes may be removed. In one embodiment, the non-aligned and/or extra nanotubes are removed by scraping them off with a Cu wire swept over the trench 12.

In another embodiment, the nanotubes are aligned in a suspension before deposition of the nanotubes 14 into the trench 12. The suspension may be the same as described above with reference to FIG. 11A. An electric field may be applied to a container having the nanotubes and the suspension to align the nanotubes in the suspension, as shown in FIG. 11B. In one embodiment, the electric field is created by placing two electrode plates on either side of the container that contains the nanotube suspension.

The die 10 can then be dipped into the nanotubes suspension. In one embodiment, the trench is aligned in the direction of the electric field. The die is then removed from the suspension and dried to evaporate the solvent. The process may be repeated multiple times until the trench is completely filed with aligned nanotubes.

Figure 11C:
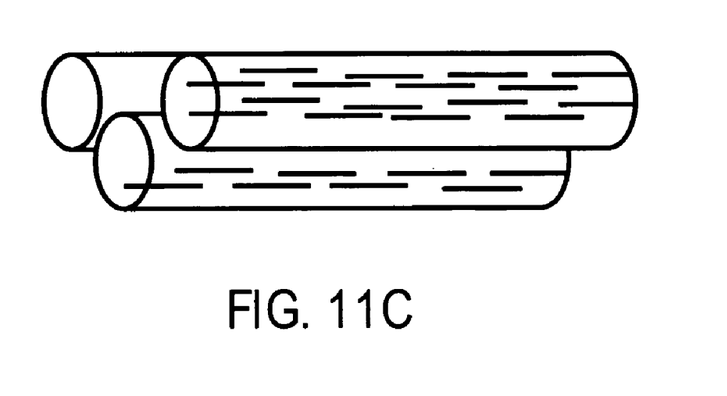
FIG. 11C is a schematic view of aligned carbon nanotubes in a fiber according to an embodiment of the invention.

In a further embodiment, an electro-spun fiber containing aligned nanotubes can be formed, as shown in FIG. 11C. The fibers may be composite polymer-nanotube fibers. In one embodiment, the fibers are about 100 nm in diameter and a few hundred microns in length. The nanotubes are aligned in the direction of the fiber axis. Electro-spinning begins with a solution of nanotubes and polymer in a solvent. The solvent is sprayed onto a plate under the application of an electric field. The field aligns the nanotubes, and the spray atomizes the solution. The solvent is evaporated and the resulting material is a polymer fiber containing nanotubes aligned in the direction of the fiber. The fibers are packed in the trench, such that the fiber axis is aligned with the trench axis. The substrate may optionally be heated to remove the polymer and expose the nanotubes. The polymer can also be removed by applying a solvent to dissolve the polymer to expose the nanotubes.

A passivation process may follow deposition of the aligned nanotubes in the trench. Any passivation technique may follow, including, for example: 1) a single thick SiN layer; 2) a thin SiN with SiO2 as an ILD and a top SiN layer; 3) a SiN with SiO2, a top SiN and polymide (or other polymer); and the like. An exemplary passivation process will now be described with reference to FIGS. 12-17.

Figure 12:
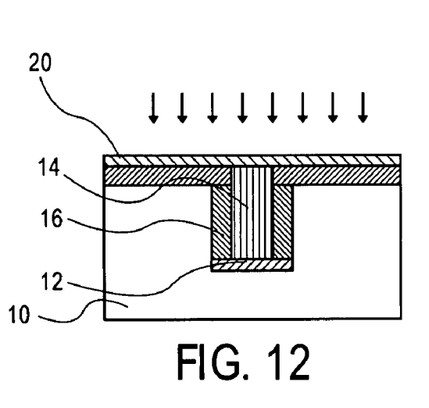
FIG. 12 is a side cross-sectional view of deposition of a passiviation layer over the trench according to an embodiment of the invention.

After the nanotubes are aligned in the trench 12, the process continues by forming a passivation layer 20 over the nanotubes 14 and die 10, as shown in FIG. 12.

Figure 13:
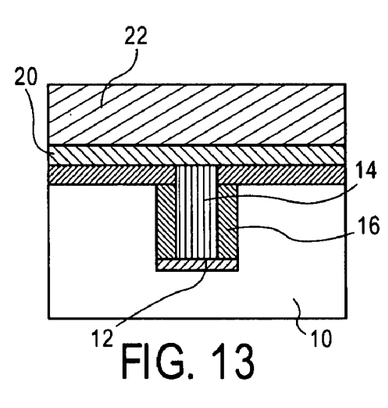
FIG. 13 is a side cross-sectional view of deposition of an interlayer dielectric (ILD) over the passivation layer according to an embodiment of the invention.

As shown in FIG. 13, the process continues by forming an ILD 22 over the passivation layer 20.

Figure 14:
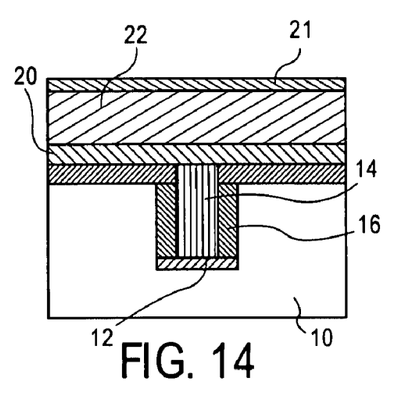
FIG. 14 is a side cross-sectional view of deposition of a passivation layer over the ILD according to an embodiment of the invention.

As shown in FIG. 14, the process continues by depositing a passivation layer 21 over the ILD 22.

Figure 15:
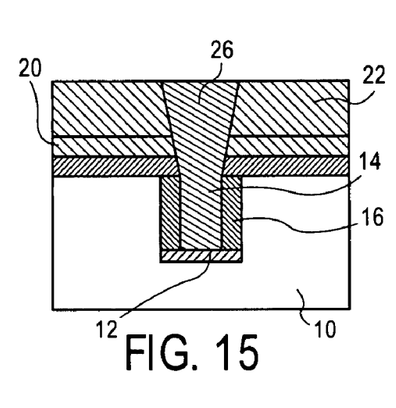
FIG. 15 is a side cross-sectional view of formation of contact extensions according to an embodiment of the invention.

As shown in FIG. 15, the process continues by forming the contact extensions 26 in the passivation layers 20, 21 and ILD 22.

Figure 16:
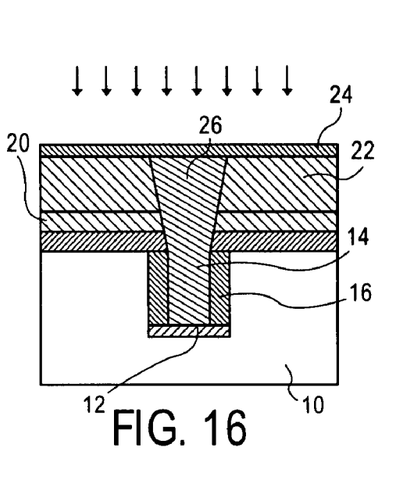
FIG. 16 is a side cross-sectional view of deposition of a top layer according to an embodiment of the invention.

As shown in FIG. 16, a top layer 24 is formed over the contact extensions 26 and ILD 22.

Figure 17:
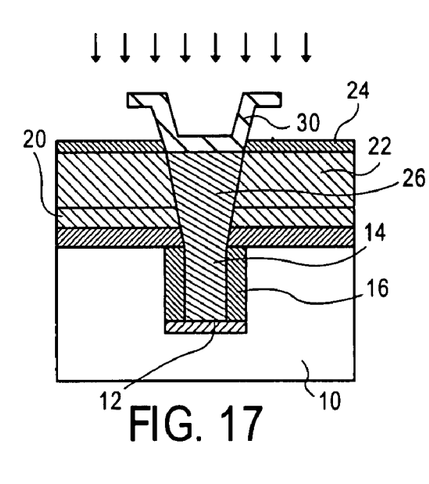
FIG. 17 is a side cross-sectional view of deposition of a contact pad over the contact according to an embodiment of the invention.

As shown in FIG. 17, the process continues by forming contact pads 30 on the contact extensions 26.

In use, a load is applied to the substrate 10. In one embodiment, the load is applied by bending the substrate 10. Application of the load induces stress in the die, which is measurable by the stress sensor, described above with reference to FIGS. 1 and 2. In particular, the nanotubes in the trench respond to the stress on the die, and the response of the nanotubes can be converted into a stress measurement.

The nanotubes 14 have an average resistance which is a function of their geometry. As the nanotubes experience changes in stress within the die due to temperature and/or pressure changes, the resistance of the nanotubes in the trench changes according to the piezo-resistive response of the nanotubes. By monitoring this resistance, the stress can be determined, using, for example, the following equation:

$$\frac{\Delta R}{R} = K\varepsilon \quad \text{(Eq. 1)}$$

where $\Delta R$ is the change in resistance, R is resistance, K is a gauge factor for the film, and E is stress/strain.

The stress sensor is calibrated based on known strain/deflections for a die to determine the gauge factor K.

In one embodiment, the nanotubes 14 are single walled carbon nanotubes (SWCN). Using a common four point bend measurement and equations for strength of material, the values of resistivity for a SWCN transferred into stress on bulk silicon are approximately about 250 kPa for a 20-25 nm deflection. The equation for calculating the stress can be determined by the following equation:

$$\sigma = \varepsilon \cdot 131(GPa) \quad \text{(Eq. 2)}$$
$$\varepsilon = \frac{3h\delta}{a(3L - 4a)}$$

where L is the length between the two contacts, a is the distance from the load point application to a fixed boundary, h is the thickness of the trench; $\delta$ is the deflection of the nanotubes, $\epsilon$ is strain, and $\sigma$ is stress.

Figure 18:
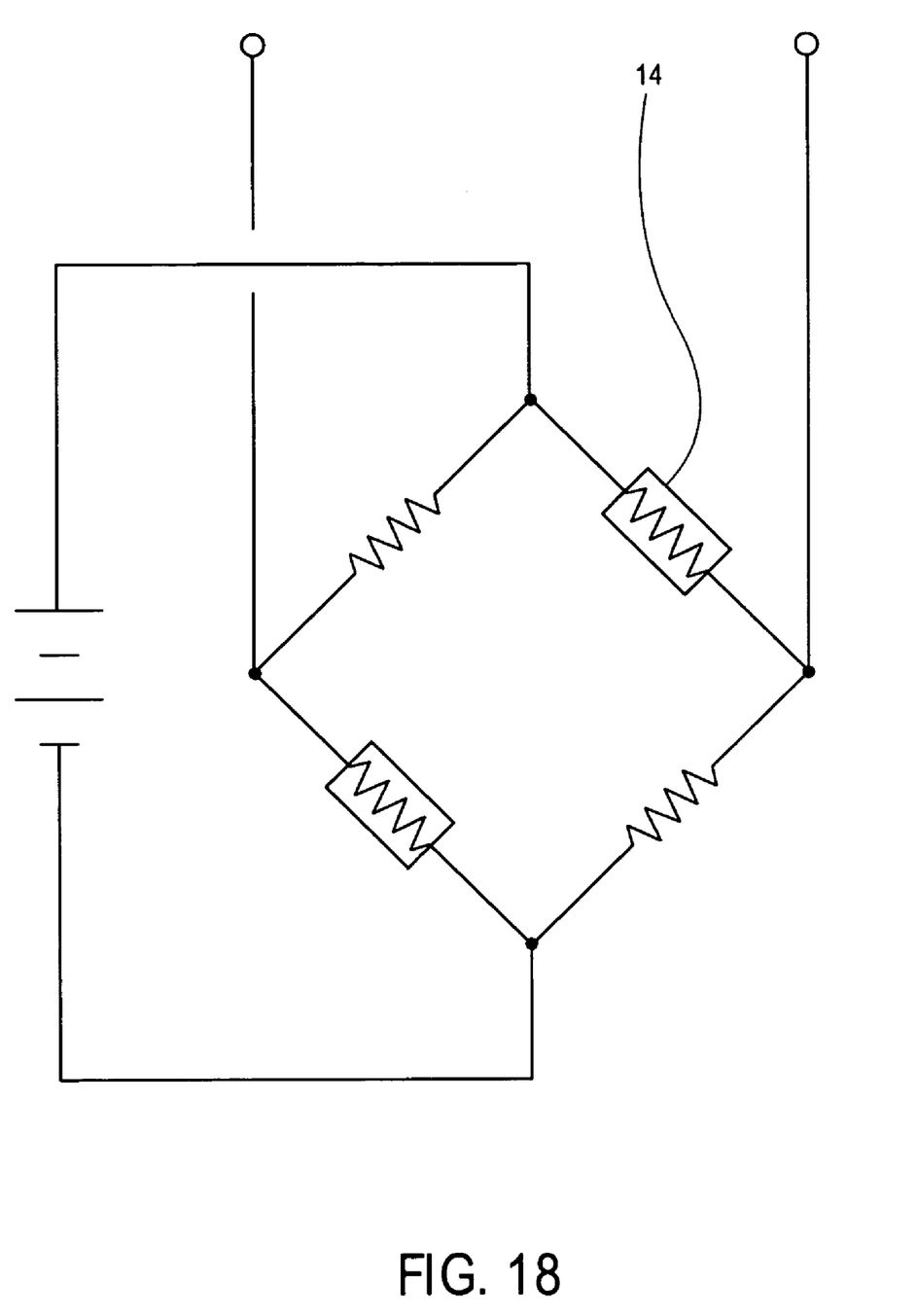
FIG. 18 is a schematic view of a four terminal structure for measuring resistance of the nanotubes.

A typical four terminal structure may be used to measure the electrical response of the nanotubes 14, as shown in FIG. 18. Voltage is applied to form a current, and the change in current is measured (i.e., electrical resistivity) to determine the strain in the nanotubes 14 when a load is applied to the substrate. It will be appreciated that other well-known techniques for measuring strain based on electrical response may also be used with the stress sensor described herein.

In one embodiment, the strain is determined from the change in resistance and the stress is calculated, as described above. In one embodiment, an empirical table is used to determine the stress in the die from the load applied and resistance response.

Embodiments of the present invention are advantageous because the stress sensor can be incorporated into the die without damaging the original stress distribution in the die. In addition, because of their anisotropic structure and piezoelectric properties, nanotubes show an electrical signal response to stresses in specific directions. Carbon nanotubes sensors are also robust at small sizes.

The methods which are described and illustrated herein are not limited to the exact sequence of acts described, nor are they necessarily limited to the practice of all of the acts set forth. Other sequences of events or acts, or less than all of the events, or simultaneous occurrence of the events, may be utilized in practicing the embodiments of the present invention.

The foregoing description with attached drawings is only illustrative of possible embodiments of the described method and should only be construed as such. Other persons of ordinary skill in the art will realize that many other specific embodiments are possible that fall within the scope and spirit of the present idea. The scope of the invention is indicated by the following claims rather than by the foregoing description. Any and all modifications which come within the meaning and range of equivalency of the following claims are to be considered within their scope.

The invention claimed is:

1. A stress sensor comprising:
a die having an opening formed in a semiconductor substrate of the die said semiconductor substrate having a top surface;
a plurality of carbon nanotubes having first ends opposite second ends disposed in the opening wherein said plurality of carbon nanotubes are embedded within said semiconductor substrate wherein said plurality of carbon nanotubes are aligned in a direction parallel to said top surface of said semiconductor substrate; and
first and second contacts electrically connectable with the first and second ends of the plurality of carbon nanotubes, respectively.

2. The stress sensor of claim 1, wherein the opening comprises a trench having a length, and wherein each of the plurality of nanotubes are aligned in a direction corresponding to the length of the trench.

3. The stress sensor of claim 2, wherein the first and second contacts are each at respective first and second ends of the trench.

4. The stress sensor of claim 1, wherein the carbon nanotubes are single-walled carbon nanotubes.

5. The stress sensor of claim 1, wherein the carbon nanotubes are selected from the group consisting of metallic-type, dielectric-type and semiconductor-type carbon nanotubes.

6. The stress sensor of claim 1, wherein the semiconductor substrate comprises a silicon substrate.

7. The stress sensor of claim 1, wherein the first and second contacts are plated copper or plated gold.

8. The stress sensor of claim 1, further comprising a transistor formed in the substate wherein said opening in said semiconductor substrate is formed to a depth which is similar to a depth of the transistor formed in the substrate.

9. The stress sensor of claim 1 wherein said first ends and said second ends of said plurality of carbon nanotubes are embedded within said semiconductor substrate.

10. The stress sensor of claim 1 wherein said first and said second contacts have a portion within said semiconductor substrate which electrically connects to said first and said second ends of the plurality of carbon nanotubes, respectively.

* * * * *